MICROWAVE AMPLIFIER AND OSCILLATOR

Filed April 19, 1966 2 Sheets-Sheet 1

INVENTORS: H.E. EARL, JR.
K.E. WOO
BY
Sylvan Sherman
ATTORNEY

MICROWAVE AMPLIFIER AND OSCILLATOR

United States Patent Office 3,416,095
Patented Dec. 10, 1968

3,416,095

MICROWAVE AMPLIFIER AND OSCILLATOR

Herbert E. Earl, Jr., Monroe Township, Middlesex County, N.J., and Kenneth E. Woo, South Pasadena, Calif., assignors to Bell Telephone Laboratories, Incorporated, New York, N.Y., a corporation of New York Filed Apr. 19, 1966, Ser. No. 543,626
6 Claims. (Cl. 330—56)

This invention relates to solid-state microwave amplifiers and oscillators utilizing a plurality of negative resistance elements transversely distributed across a wavepath.

As is known, developments in the semi-conductor art have given rise to a variety of devices whose voltage-current characteristics exhibit regions of negative dynamic resistance. These include the so-called "tunnel" diodes, pnpn diodes and IMPATT diodes.

Many of the amplifier structures employing negative resistance diodes as active elements enjoy certain advantages such as low noise figure, ability to operate at high frequencies and very low power requirements. Along with these advantages, however, there are also the disadvantages of low gain and low power handling capability.

One of the methods proposed for increasing the power handling capabilities of diode amplifiers is to connect a number of them in series. This arrangement, however, gives rise to a number of problems, such as providing individual bias to each diode of the combination, and providing means for independently mounting and tuning the several diodes.

In accordance with the present invention, the problems of biasing and tuning individual diodes in an arrangement employing a plurality of series-coupled diodes is resolved by separately mounting each diode in its own holder and stacking them, one upon another, across the wavepath. Each of the holders provides means for separately biasing the respective diodes, and each of the holders is independently capable of transverse movement across the wavepath, thereby providing a convenient means for individually tuning each of the diodes.

Among the advantages of an amplifier constructed in accordance with the present invention is its high impedance, its broadband response, and its high gain and power handling capability. It is a further advantage of the invention that the ability to bias and to tune the individual diodes for optimum operation is retained.

These and other objects and advantages, the nature of the present invention, and its various features, will appear more fully upon consideration of the various illustrative embodiments now to be described in detail in connection with the accompanying drawings, in which.

Figure 1:
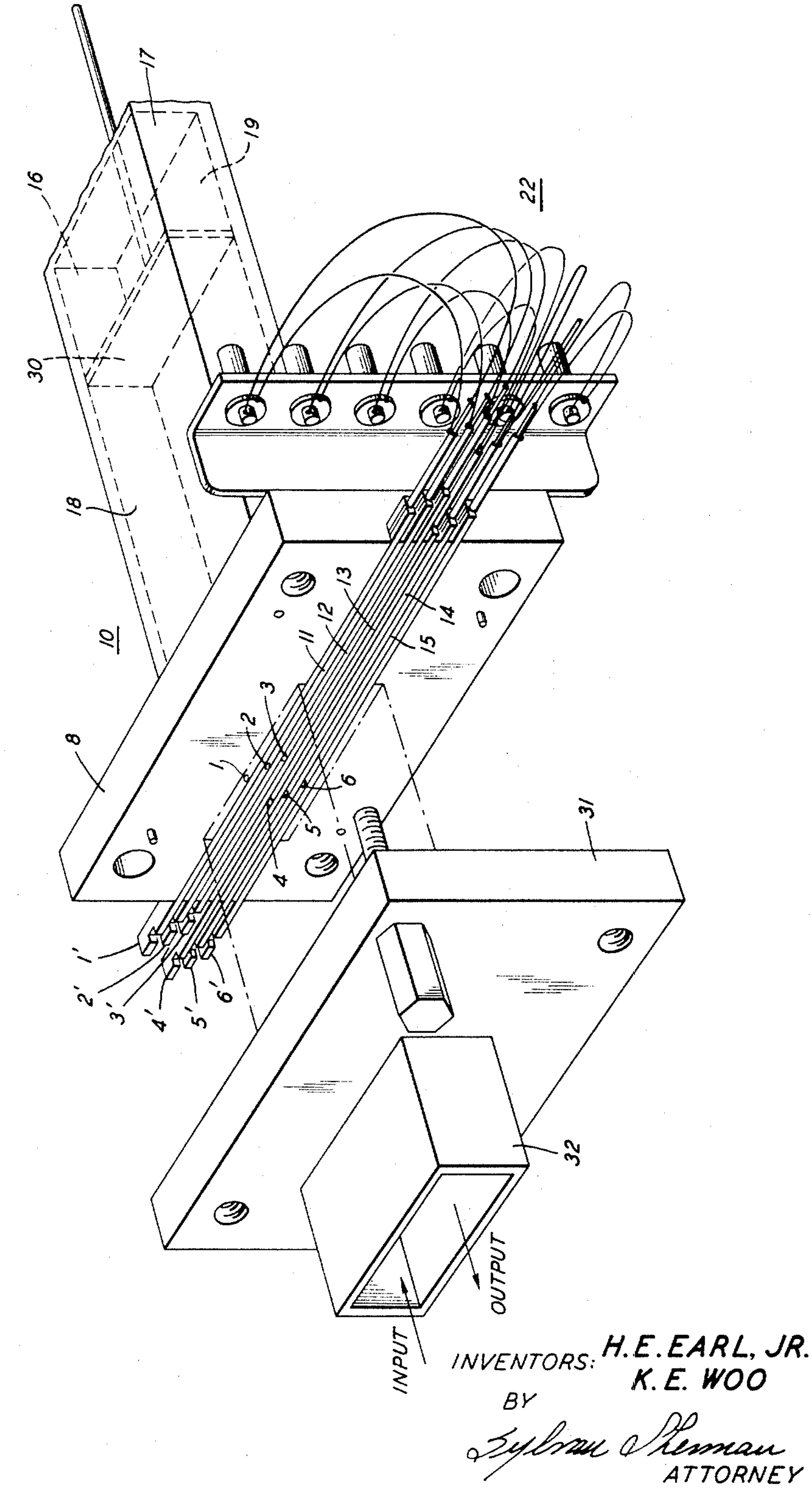
FIG. 1 shows, in perspective, a first embodiment of the invention using six diodes stacked across a rectangular waveguide.

Referring to the drawings, FIG. 1 shows, in perspective, an illustrative embodiment of the invention in which six diodes 1, 2, 3, 4, 5 and 6 are separately mounted in individual holders 1′, 2′, 3′, 4′, 5′ and 6′ which are stacked across the narrow dimension of a rectangular waveguide 10. In particular, the holders lie in a common plane that is oriented perpendicular to the direction of wave propagation. Advantageously, the waveguide is divided into six equal compartments by means of thin metallic partitions 11, 12, 13, 14 and 15 which are supported by an apertured flange 8 through which one end of guide 10 passes. The partitions extend between the narrow guide walls 16 and 17 in a direction parallel to the board walls 18 and 19 to form short lengths of reduced-height waveguide. One diode is included in each of these reduced-height guides.

An adjustable tuning piston 30 is located in guide 10 at a distance from the diode assemblage. This distance, typically, is made equal to an integral odd number of quarter wavelengths at the frequency of interest.

The diode holders are held in place by means of a second flange 31 which abuts against flange 8. When secured in place by bolts, or other suitable means, longitudinal displacement of the holders is prevented. However, the holders, and the diodes mounted therein, can be moved transversely across guide 10 in the direction parallel to its broad dimension.

Wave energy is coupled to and from the diodes by way of a second section of waveguide 32 which extends through an aperture in flange 31 and abuts upon the diode holders. Bias for each of the diodes is applied individually through connections 22 at one end of the diode holders, as explained in greater detail hereinbelow.

Because of the necessity of individually biasing each of the diodes, and the desirability of individually tuning each of the diodes, specially constructed diode mountings are employed. The following description is of an experimental, six diode X-band amplifier, constructed for use in a 0.400 inch by 0.900 inch rectangular waveguide. To accommodate the six diodes, the guide is divided into six reduced-height guide sections that are each 0.050 inch high and 0.100 inch deep.

Figure 2:
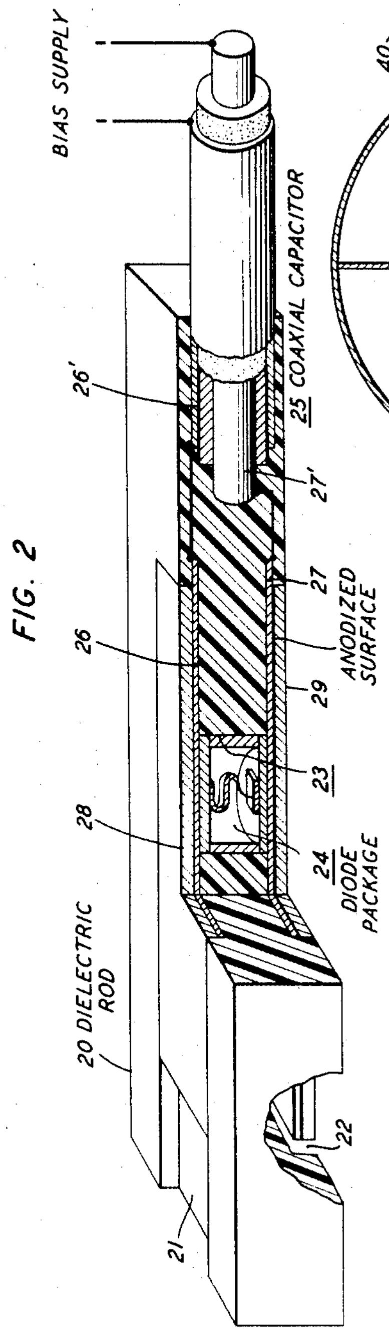
FIG. 2 is an enlarged view of one of the diode holders.

Each of the diode holders, one of which is shown in greater detail in FIG. 2, is made of a Plexiglas material that is cut into a rectangular shaped rod 20 whose dimensions are 0.050 inch high, 0.100 wide and 3.0 inches long. Each rod is then milled along both of the 0.100 inch width sides to form grooves 21 and 22 that are 0.050 inch wide and 0.007 inch deep, thus obtaining an I-beam cross section. These grooves support metallic ribbons, as will be explained in greater detail hereinbelow.

A 0.062 inch hole 23 is drilled in the center of rod 20 for holding the diode package 24. The latter, for the particular embodiment being described, is an encapsulated 2 ma. point contact p-type Ge tunnel diode that forms a package 0.035 inch high and 0.060 inch in diameter.

One end of rod 20 is fitted with a one inch length of coaxial capacitor 25 for isolating the bias supply from the high frequency signal. These capacitors, which have a capacitance of approximately 300 pf. per inch, are of the type described by F. A. Braun and R. F. Trambarulo in their copending application Ser. No. 146,768, filed Oct. 23, 1961, and assigned to applicant's assignee.

With the diode package 24 and the capacitor 25 in place, a pair of fine metal ribbons 26 and 27, each 0.050 inch by 0.002 inch by 1.6 inches, are cemented into grooves 21 and 22 and soldered to the inner and outer conductors 26′ and 27′, respectively, of capacitor 25. These ribbons make contact with the anode and cathode of the diode and are the bias leads for the diode. A second pair of metallic ribbons 28 and 29, each 0.050 inch by 0.006 inch by 1.5 inches, are then cemented onto the bias leads 26 and 27, respectively. One of the metallic ribbons 28 is a plain aluminum strip which, when in place, completes a continuous conductive path between the diode and one of the metallic partitions of the waveguide, and, thereby, directly grounds one side of the diode. The other metallic ribbon 29 is anodized along one side and, when cemented in place, forms a strip capacitor with the adjacent metallic ribbon 27. The unanodized outer surface of ribbon 29 makes conductive contact with another of the metallic partitions of waveguide 20 thereby providing high frequency coupling to the waveguide while isolating the bias circuit. Capacitance of about 400 pf. were readily obtained in this manner.

The present invention can be used either as an oscillator or as an amplifier. In fact, the device is normally adjusted to oscillate in either case, but is then slightly detuned so as to operate just below the oscillating threshold when used as an amplifier. For example, the procedure typically is to bias each of the diodes to an operating point within the negative resistance region of its current-voltage characteristic. An externally supplied seeding signal, at the frequency of interest, is then introduced into waveguide 32, and the position of shorting piston 30 adjusted such that it is spaced from the diodes a distance equivalent to an integral number of odd quarter wavelengths at the frequency of the applied signal. The seeding signal serves to phase-lock the several oscillators.

The lateral position of each diode within the wavepath is adjusted until the output signal is a maximum for the given piston position and bias settings. The bias settings are then readjusted, and additional small changes made in the diode positions and in the piston position to further optimize the oscillator performance. The seeding signal is finally removed.

To operate as an amplifier, the oscillator is detuned slightly or mismatched sufficiently so as to be just below the oscillating threshold. This can be done either by changing the bias setting on all of the diodes or by changing the lateral positions of all of the diodes.

Since an amplifier in accordance with the present invention is single-ended, a circulator (not shown), connected to the input end of guide 32, may be used as a convenient means of isolating the input circuit from the amplified output signal.

The total gain that can be realized in this type of amplifier is equal to the gain per diode, multiplied by the number of diodes. For higher gain, more diodes can be stacked across the waveguide. Thus, while six diodes are shown in FIG. 1, it is to be understood that this is merely intended to be illustrative, and that more or fewer diodes can be used, subject, of course, to space limitations.

The bandwidth of such a device is essentially that portion of the frequency locking range which is common to all the diodes operating as oscillators. Since the frequency locking range of a tunnel diode oscillator is usually rather broad, the bandwidth of an amplifier using tunnel diodes is correspondingly broad if the diodes are reasonably similar.

Figure 3:
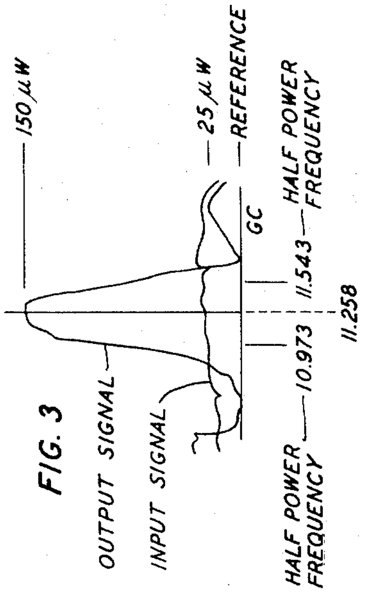
FIG. 3 shows the response characteristic of an experimental amplifier constructed in accordance with the invention.

FIG. 3 shows the gain characteristic of an experimental amplifier constructed in the manner described above. The swept-frequency input signal is approximately 25 $\mu$w. The peak output is about 150 $\mu$w., which is approximately equal to the sum of the output of the six diodes operating individually as oscillators and feeding a matched load. The 3db bandwidth is 570 mc., centered at 11.258 gc.

In the absence of an external signal, and with proper tuning, the six diodes phase-lock themselves and oscillate at a common frequency.

Figure 4:
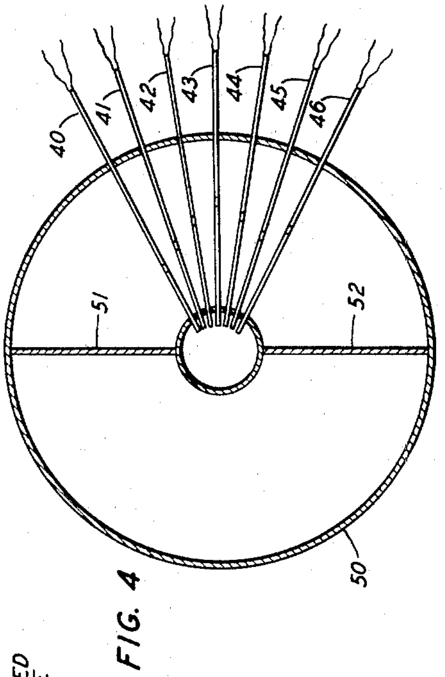
FIG. 4 shows the invention using circular waveguide.

FIG. 1 is illustrative of an embodiment of the invention using rectangular waveguides. However, other waveguiding media can also be used, as illustrated in FIG. 4 wherein a circular waveguide 50 is used. In this embodiment the diode holders 40, 41, 42, 43, 44, 45 and 46 extend radially across the wavepath through apertures along the circumference of guide 50 and through apertures in an inner supporting cylinder 51. Cylinder 51 is coaxially aligned with waveguide 50 and is held in position by radially extending support members 52 and 53. A pair of thin, metallic radial partitions may also be provided as supports for each of the holders 40 to 46. However, they are not essential and are not included in the illustrative embodiment of FIG. 4. In all other respects, the operation of the amplifier of FIG. 4 is the same as that of FIG. 1.

While the invention has been described with reference to amplifiers and oscillators, it is understood that the principles of the invention are equally applicable to other situations in which a plurality of series-coupled solid-state devices are employed and wherein it would be advantageous to be able to separately and independently bias, or otherwise adjust, each of the devices. Thus, numerous and varied other arrangements can readily be devised in accordance with these principles by those skilled in the art without departing from the spirit and scope of the invention.

What is claimed is:

1. In combination:

a section of conductively bounded waveguide supportive of electromagnetic wave energy;

a plurality of two terminal solid-state devices;

each of said devices being separately mounted and supported within individual holders;

means for stacking said holders across said waveguide in a common plane perpendicular to the direction of wave propagation;

each of said holders including means for independently applying bias to the device mounted therein;

and each of said holders being capable of transverse movement across said waveguide.

2. The combination according to claim 1 wherein:

said waveguide is a rectangular waveguide having narrow and broad dimensions, and wherein;

said holders extend across said waveguide in a direction parallel to its broad dimension.

3. The combination according to claim 1 wherein:

said waveguide is a circular waveguide, and wherein:

said holders extend radially across said waveguide.

4. The combination according to claim 1 wherein:

said devices have current-voltage characteristics which include negative resistance regions, and wherein:

adjustable means are included for conductively terminating one end of said waveguide section.

5. The combination according to claim 4 wherein:

said devices are biased and tuned to produce oscillations.

6. The combination according to claim 4 wherein:

said devices are biased and tuned to operate as an amplifier.

No references cited.

NATHAN KAUFMAN, *Primary Examiner.*

U.S. Cl. X.R.

333—97, 84; 331—97